US011002879B2

(12) United States Patent
Schindler et al.

(10) Patent No.: US 11,002,879 B2
(45) Date of Patent: May 11, 2021

(54) SENSOR DEVICE FOR THE CAPACITIVE DETECTION OF A USER ACTION IN A VEHICLE

(71) Applicant: Huf Hülsbeck & Fürst GmbH & Co. KG, Velbert (DE)

(72) Inventors: Mirko Schindler, Velbert (DE); Iko Lindic, Essen (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 146 days.

(21) Appl. No.: 16/120,304

(22) Filed: Sep. 3, 2018

(65) Prior Publication Data

US 2019/0072691 A1    Mar. 7, 2019

(30) Foreign Application Priority Data

Sep. 5, 2017    (DE) ................... 10 2017 120 375.3

(51) Int. Cl.
*G01V 13/00*    (2006.01)
*G01V 3/08*    (2006.01)
(Continued)

(52) U.S. Cl.
CPC ............. *G01V 13/00* (2013.01); *E05F 15/46* (2015.01); *E05F 15/73* (2015.01); *G01V 3/08* (2013.01);
(Continued)

(58) Field of Classification Search
CPC .......... G01V 13/00; E05F 15/00; E05F 15/42; E05F 15/46; E05F 15/443; E05F 15/73;
(Continued)

(56) References Cited

U.S. PATENT DOCUMENTS

| 2005/0092097 A1 | 5/2005 | Shank et al. | |
| 2012/0306512 A1* | 12/2012 | Kandler | B60N 2/002 324/686 |
| 2013/0293245 A1* | 11/2013 | Kuhnen | E05B 83/18 324/658 |

FOREIGN PATENT DOCUMENTS

| DE | 102013015644 | 3/2015 |
| DE | 102015003320 | 9/2016 |

OTHER PUBLICATIONS

Europäischer Recherchenbericht und die Stellungnahme zur Europäischen Recherche [European Search Report and the European Search Opinion] dated Jan. 24, 2019 From the European Patent Office Re. Application No. 18184554.6 and Its Summary in English. (9 Pages).

* cited by examiner

*Primary Examiner* — Son T Le

(57) ABSTRACT

The invention relates to a sensor device (100) for the n capacitive detection of a user action in a vehicle (1), with a sensor element (110), which is configured as an electric line element, wherein the sensor element (110) comprises:
an electrically conducting outer conductor element (112),
at least one insulator element (120) for the electric insulation of the outer conductor element (112),
an evaluation connection adaptation (20) on the outer conductor element (112) for the electrically-conducting connection of the outer conductor element (112) to an evaluation device (210) of the vehicle (1), whereby the detection can be performed.
A test connection adaptation (10) in provided on the outer conductor element (112), in order to test a functional test of the sensor device (100) based upon an electric circuit with the outer conductor element (112).

18 Claims, 3 Drawing Sheets

(51) Int. Cl.
*E05F 15/73* (2015.01)
*H03K 17/955* (2006.01)
*E05F 15/46* (2015.01)
*E05F 15/42* (2015.01)
*E05B 81/76* (2014.01)

(52) U.S. Cl.
CPC ............ *H03K 17/955* (2013.01); *E05B 81/76* (2013.01); *E05F 2015/487* (2015.01); *E05Y 2400/858* (2013.01); *E05Y 2900/50* (2013.01); *E05Y 2900/546* (2013.01); *H03K 2217/96078* (2013.01); *H03K 2217/960705* (2013.01)

(58) Field of Classification Search
CPC ..... H03K 17/955; H03K 2217/960705; H03K 2217/96078; E05Y 2900/50; E05Y 2400/858; E05Y 2900/546; E05Y 2900/55; B60R 19/48
See application file for complete search history.

SENSOR DEVICE FOR THE CAPACITIVE DETECTION OF A USER ACTION IN A VEHICLE

RELATED APPLICATION

This application claims the benefit of priority of German Patent Application No. 10 2017 120 375.3 filed on Sep. 5, 2017, the contents of which are incorporated herein by reference in their entirety.

FIELD AND BACKGROUND OF THE INVENTION

The present invention relates to a sensor device according to the type more specifically defined in the preamble of claim 1. Furthermore, the invention relates to a system according to the preamble of claim 11, to a vehicle as well as to a method for operating a capacitive sensor device in a vehicle.

Sensor devices for the capacitive detection of a user action in a vehicle are used in the rear zone of a vehicle in the prior art. For example, a sensor element can extend in the region of a bumper to detect a movement of a user as a user action. A foot movement, which leads to the opening of a tailgate of the vehicle, is detected, for example.

It is known here that a capacitive evaluation of the sensor device is effected for the detection of the user action. A change in capacitance in the sensor device indicates the user action, and is measured by means of an evaluation device of the vehicle.

Thus, an electric connection between the evaluation device and a sensor element of the sensor device is necessary for the reliable and correct detection of the user action. A faulty or erroneous connection cannot or only insufficiently be detected in the known solutions. Furthermore, known solutions often necessitate high technical efforts, which additionally increases the costs for the sensor device.

SUMMARY OF THE INVENTION

Thus, it is an object of the present invention to at least partially remove the above-described drawbacks. It is particularly an object of the present invention to provide a technically simplified and/or cost-favorable option for the reliable operation of a sensor device.

The above object is achieved by means of a sensor device having the features of the independent device claim, a system having the features of the independent system claim, a vehicle having the features of the independent device claim as well as by a method having the features of the independent method claim. Further features and details of the invention result from the respective dependent claims, the description and the drawings. Features and details that have been described in conjunction with the sensor device according to the invention naturally also apply in conjunction with the system according to the invention, the vehicle according to the invention, as well as the method according to the invention, and vice versa, so that reference can be mutually made to the individual aspects of the invention in any case in regard to the disclosure.

The object is, in particular, achieved by means of a sensor device for the capacitive detection of a user action, preferably an approach and/or a gesture, in a vehicle. For example, an approach and/or a motion sequence, e.g. of a leg or a foot of a user at the vehicle, can be detected. This can be advantageous if the sensor device, and in particular a sensor element, is arranged in the rear and/or side region of the vehicle, e.g. below a tailgate and/or below the (sliding) doors and/or in the region of a bumper and/or inside the bumper. In the case of an arrangement in the rear zone, the sensor device can be configured as a so-called "kick sensor", the detection of the user action of which leads to a motorized opening process of the tailgate. As a result, a significant increase in comfort is possible in the operation of the vehicle.

According to another advantage, it can be provided that a monitoring zone in the lateral and/or rear zone of the vehicle is monitored by means of the sensor device to detect an approach and/or a movement as a user action in the monitoring zone. An authentication can take place to increase security prior to and/or during and/or after the successful detection, e.g. via radio with an identification transmitter (ID transponder) through an exchange of code or the like. Correspondingly, a function of the vehicle, e.g. opening of the tailgate, can be activated in a successful detection only in the event that the authentication has been successful.

Furthermore, at least one sensor element can be provided and be arranged on the vehicle, e.g. in a lateral and/or rear zone, preferably in a bumper and/or in the region of a door sill. The sensor element is preferably configured as an electric line element, such as a cable, and may thus have a longitudinal extent. Likewise, the sensor element can be formed as a sensor electrode, which is electrically connected to the vehicle or the evaluation device preferably only on one side (at one end), so that the opposite side (the other end in the axial direction) is formed to be floating and/or electrically non-connected and/or completely electrically-insulated, as the case may be.

According to a further advantage, the sensor element includes at least one of the following components:

an electrically-conducting (i.e. at least partially conductive) outer conductor element, and, possibly, also an electrically-conducting (i.e. at least partially conductive) inner conductor element, which are preferably arranged concentrically to one another, and particularly preferably the outer conductor element completely surrounds the inner conductor element in the radial plane or in the circumferential direction, at least one insulation element for the electric insulation of the outer conductor element and/or the inner conductor element, which are preferably arranged concentrically to one another and/or to the outer and/or inner conductor element, an evaluation connection adaptation on the outer conductor element for the electrically conducting connection of the outer conductor element to an evaluation device of the vehicle, whereby the detection can be performed.

It is provided here, according to an advantage of the invention, that a test connection adaptation is arranged on the outer conductor element, in order to test a functional test of the sensor device based upon an electric circuit with the outer conductor element. In other words, an electric circuit that also includes the outer conductor element can be formed by the test connection adaptation. As a result, a particularly simple, reliable and cost-efficient test of the sensor device can be provided, in order to test, as a functional test, e.g. a correct electric connection of the sensor element to the evaluation device. Such a test is needed since, as the case may be, a discrimination between a missing detection (i.e. a missing detection of the user action) and a faulty electric connection only based upon the evaluation connection adaptation cannot be made. Thus, it can be provided that a result of the evaluation of the evaluation device about the evaluation connection adaptation in a state, in which no user action exists and is thus not detected, is at least nearly identical with and can thus not be discriminated from a state in which the electric connection is faulty and/or interrupted.

Furthermore, it is optionally possible that the evaluation connection adaptation exclusively includes one connection point and/or exclusively one electric conductor, so that during the normal operation of the sensor device for the detection of the user action, exclusively one electrically-conductive connection with exclusively one connection path between the evaluation device and the sensor element is used (and thus not an uninterrupted closed electric circuit between the evaluation device and the sensor element is being used). In other words, exclusively the evaluation connection adaptation is used by the evaluation device for the capacitive detection of the user action, so that merely one single electric conductor leads from the evaluation device to the evaluation connection adaptation and/or is used for the detection of the user action. By contrast, a closed and/or uninterrupted (i.e. without a dielectric) circuit can be used for the functional test, in which two electric conductors lead to the evaluation device via the test connection adaptation. This provides the advantage that an implementation particularly simple in terms of construction of the sensor device is possible.

A further advantage results if the test connection adaptation is arranged on the outer conductor element merely at one end of the sensor element, so that the electric circuit for the functional test is arranged only one-sided or on one end of the sensor element. In other words, no continuity test is carried out between one end and the other end (in the axial direction) on the outer conductor element. Thus, the test of a correct electric coupling between the sensor element and the evaluation device is significantly simplified.

In order to detect a user action, the sensor element is evaluated by the evaluation device via the evaluation connection adaptation, e.g. in a capacitive manner. To that end, a re-loading method can be used, in which a change in capacitance is measured through repeated charging processes. To that end, for example, a capacitance can be measured repeatedly and a change of this capacitance can be detected, wherein the capacitance adjusts e.g. between the sensor element and the surroundings, such as a user, e.g. a foot of the user. The presence of a user action is indicated by a significant change in capacitance, for example, wherein to that end, a threshold is predefined, which is to be exceeded by the change in capacitance in order that the user action is positively detected. On the other hand, a missing change in capacitance can indicate a missing user action. Similarly, a missing change in capacitance can also be traced back to a faulty electric connection between the evaluation device and the evaluation connection adaptation. Thus, a particular advantage is achieved when a further test connection adaptation is used to test the electric connection.

The evaluation connection adaptation can be a part of the test connection adaptation, for example, so that an electric connection point of the evaluation connection adaptation is used for both, detection and testing (for the functional test). It can be advantageous if the evaluation connection adaptation comprises a first electric connection point on the sensor device and the test connection adaptation comprises the first electric connection point and at least one second electric connection point. Thus, a particularly cost-efficient test connection adaptation, which is simple in construction, is provided, because the first connection point can be used for both the testing and evaluation.

It can be provided in a further option that the evaluation connection adaptation comprises at least one or exclusively one first electric conductor, to connect the evaluation device to the outer conductor element for evaluating the detection, and the test connection adjustment comprises at least one or exclusively one second electric conductor and the first conductor, in order to connect the evaluation device to the outer conductor element and to provide the electric circuit for performing the functional test. In this case, the described connections between the evaluation device and the outer conductor element can exist persistently, so that both the detection and the functional test can always be performed. For example, the first electric conductor is connected to the first connection point, and the second electric conductor is connected to the second connection point of the test connection adaptation. Likewise, it can be possible that the first and/or second electric conductor respectively comprises multiple electric conductor means, such as wires or strands. This enables possible to use e.g. a wire mesh of the outer conductor element in a simplified manner in connection with the evaluation device.

Furthermore, it is conceivable that the test connection adaptation comprises at least one connection means, preferably a crimp connector, to electrically connect the outer conductor element to the evaluation device, so that the functional test can be performed by the evaluation device, wherein preferably the functional test is configured as a connection test. For example, at least one conductor means, e.g. a wire and/or a strand, can be connected to the crimp connector in a form-fit and/or force-fit manner, to establish the electric connection to the evaluation device. For example, a crimp connector for each of the connection points, or each of the conductors can be used here. This enables a reliable and simple mechanical connection.

Another advantage can be achieved, in the scope of the invention, when the sensor element comprises an electrically-conducting inner conductor element and preferably the at least one insulation element surrounds (e.g. in circumferential direction) the inner conductor element for electric insulation. Preferably, the inner conductor element can be electrically insulated completely and from all sides and/or be completely and from all sides electrically non-connected. For example, the inner conductor element is formed as a core of the sensor element formed as a cable, and includes, for example, at least one strand and/or exclusively one electrically-conductive wire. Preferably, the inner conductor element has the same length in the axial direction (i.e. in the longitudinal direction of the sensor element) as the outer conductor element and/or the insulator element. An important advantage of using the inner conductor element is that the handling and/or manufacture of the sensor element can be significantly simplified. Thus, the extrusion process can be improved and/or the mounting of the sensor element in the vehicle can be simplified, e.g. the installation and/or orientation in a bumper. To that end, the inner conductor element can also have a plastic deformability to influence the longitudinal extension of the sensor element. For example, the inner conductor element comprises copper or silver to provide an electric conductivity and/or higher stability.

Furthermore, it can be possible that the sensor element is formed as an electric cable and preferably comprises an inner conductor element as a core and the outer conductor element as a shield. Advantageously, the sensor element is formed as a sensor electrode, so that special mechanic and electric advantages develop due to the in particular coaxial structure of the inner conductor element and the outer conductor element. For example, the surroundings of the sensor element serves as a dielectric to a further type of electrode, such as the user, when the user action is carried out.

In accordance with other possibilities, the outer conductor element may comprise at least one electric conductor formed separately from the inner conductor element, preferably from an electrically conductive metal or plastic material.

Optionally, it is conceivable that the outer conductor element is formed as a wire mesh. In particular, the outer conductor element can completely surround an inner conductor element of the sensor element in circumferential direction. The usable sensor surface can be significantly enlarged here, and thus the detection of the user action can be improved.

It is also advantageous here if, in the scope of the invention, the sensor element has a concentric structure, wherein preferably the outer conductor element is arranged coaxially to an inner conductor element of the sensor element. For example, the at least one insulation element, or one of the insulation elements, can be arranged between the outer conductor element and the inner conductor element, to electrically insulate the outer conductor element from the inner conductor element. To that end, the insulation element is, for example, made of an electrically-insulating material, such as plastic. Thus, electric malfunctioning can be prevented in the detection of the user action.

In addition, it is conceivable in the scope of the invention that the insulator element comprises a first insulator element, in particular for the inner conductor element, and a second insulation element, in particular for the outer conductor element, which are arranged concentrically. Electrical and/or mechanical properties of the sensor element can be improved thereby.

A further advantage can be achieved in the scope of the invention, when the sensor element has a longitudinal extension along a longitudinal axis between a first end, which preferably faces the evaluation device, and a second end, which preferably faces away from the evaluation device, and in particular the test connection adaptation and/or the evaluation connection adaptation are exclusively provided on one of the ends on the sensor element, and preferably a first conductor and a second conductor are connected only on one of the ends to the outer conductor element, so that preferably the second end is electrically non-connected, particularly preferred potential-free. This is advantageous particularly because the sensor element does not have to be connected to the evaluation device in the form of a loop, and thus a more flexible arrangement in the vehicle is possible.

Furthermore, it is conceivable that the outer conductor element and preferably an inner conductor element extend along the longitudinal extension of the sensor element, so that preferably the inner conductor element and the outer conductor element extend parallel to one another. This significantly simplifies the production and handling of the sensor element.

The invention also relates to a system for the capacitive detection of a user action in a vehicle, including:
  a sensor element which is configured as an electric line element, preferably as an electric cable,
  an evaluation device for evaluating the sensor element, wherein the sensor element comprises:
  an electrically-conducting outer conductor element, and/or
  at least one insulation element for the electric insulation of the outer conductor element, and/or
  an evaluation connection adaptation on the outer conductor element for the electrically-conducting connection of the outer conductor element to the evaluation device, whereby the detection can be performed.

It is particularly possible here that a test connection adaptation is provided on the outer conductor element, in order to test a functional test of the sensor device based upon an electric circuit with the outer conductor element. Thus, the system according to the invention provides the same advantages as have been described in detail in regard to the sensor device according to the invention. In addition, the system may comprise a sensor device according to the invention.

Another advantage can be achieved in the scope of the system according to the invention when the evaluation device is configured as a control unit of the vehicle and/or as a microcontroller and/or as an integrated circuit. For example, the evaluation device can be connected to a central vehicle electronics or be part of the central vehicle electronics, in order to perform an authentication, for example. For example, a data exchange between the evaluation device and the central vehicle electronics can be provided. This enables possible to use the capacitive detection of the sensor device in various manners for the vehicle.

Optionally, it can be provided that an electric connection interface, preferably a plug, is electrically connected to the evaluation device and a first and second conductor of the outer conductor element is electrically connected to the evaluation device via the connection interface. For example, the connection interface may comprise a housing, which is formed as to be electrically insulating. This enables a simplified mounting for the production of the connection between the evaluation device and the outer conductor element.

Advantageously, it can be provided in the scope of the invention that a first conductor, adjacent to a second conductor is electrically connected to the outer conductor element, in particular at a maximum distance of 1 mm to 40 mm, preferably 2 mm to 30 mm, preferably 5 mm to 20 mm, whereby the outer conductor element is serially integrated in a current path to the first and second conductor. Thus, the mounting of the sensor device can be significantly simplified, since the connections for the production of the current path have to be produced merely on one side and in direct vicinity on the sensor element. A basic idea is that not a complete continuity test (in the axial direction) of the sensor element must be carried out, but instead a single-sided or one-sided configuration of an electric circuit on one end of the sensor element is sufficient.

The invention also relates to a vehicle comprising a system according to the invention for the capacitive detection of a user action.

Thus, the vehicle according to the invention provides the same advantages as have been described in detail with respect to the system according to the invention and/or a sensor device according to the invention.

Furthermore, it is conceivable that the sensor element is arranged in a bumper of the vehicle in order to detect the movement of a foot of a user in the rear zone of the vehicle. Alternatively or additionally, the sensor element can be arranged in the region of a door sill of the vehicle, in order to detect a foot movement of a user in the lateral region of the vehicle. For example, this detection serves for the activation of an opening movement of a tailgate or a sliding door of the vehicle.

The invention also relates to a method for operating a capacitive sensor device, in particular a sensor device according to the invention, in a vehicle, in particular a vehicle according to the invention, and/or in a system according to the invention. It is preferably provided here that at least one of the following steps is performed, preferably successively, or in any order, wherein preferably individual steps can also be performed repeatedly:

Performing a connection test in the sensor device by an evaluation device, wherein an electric current is conducted via at least two conductors through an outer conductor element of a sensor element of the sensor device, performing a detection of a user action at the vehicle, wherein an electric evaluation is effected to that end based upon one of the conductors and the outer conductor element.

Thus, the method according to the invention provides the same advantages as have been described with reference to a system according to the invention and/or a sensor device according to the invention.

Optionally, it can be possible that the steps of the method according to the invention are performed with each start of the motor, in order to carry out the functional test. It is conceivable here, that in case of an incorrect function test a warning message is issued to a user, for example in the region of a dashboard and/or a combined instrument of a vehicle. Alternatively or additionally, it can be possible that a logging of the error takes place in a failing functional test, e.g. also without outputting a notification to the user.

Preferably, it can be provided that the following step is provided prior to the performing of the connection test:

Connecting the sensor element of the sensor device to an evaluation device of the vehicle via a connection interface.

In particular, this step can be a mounting step in the mounting of the sensor device.

BRIEF DESCRIPTION OF THE SEVERAL VIEWS OF THE DRAWINGS

Further advantages, features and details of the invention result from the following description, in which exemplary embodiments of the invention have been described in detail with reference to the drawings. Here, the features mentioned in the claims and in the description can each per se or in any combination be essential to the invention. The Figures schematically show in:

Identical reference characters will be used throughout the figures for the same technical features even of different exemplary embodiments.

DESCRIPTION OF SPECIFIC EMBODIMENTS OF THE INVENTION

Figure 1:
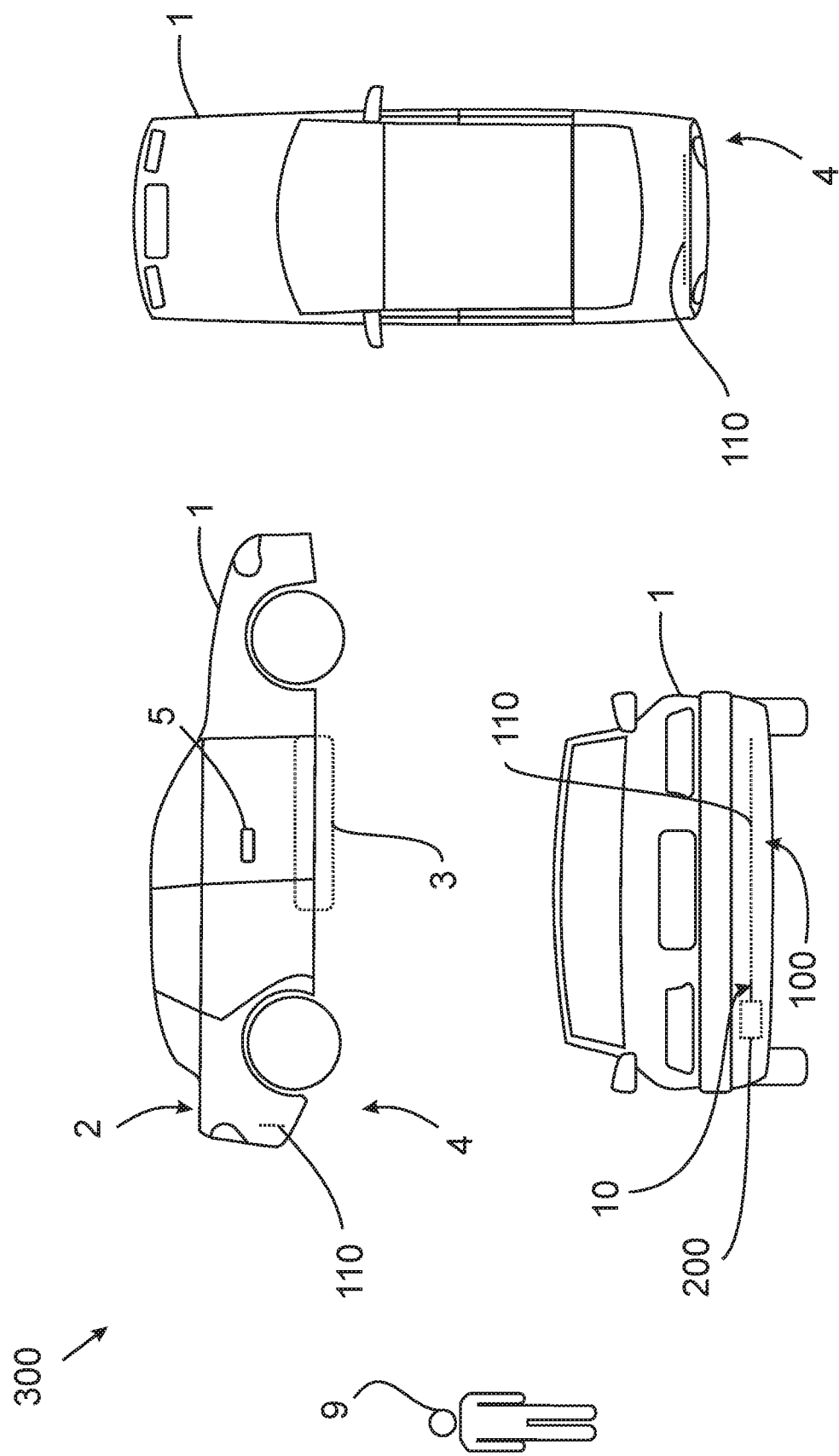
FIG. 1: different views of a vehicle according to the invention.

FIG. 1 schematically shows different views of a vehicle 1, a side view (top left), a rear view (bottom left) as well as a plan view (right). Furthermore, parts of a system 300 according to the invention are shown, which serves for the capacitive detection of a user action of a user 9. Such a user action can, for example, be a movement in the region of a bumper 4 in the rear zone of the vehicle 1 and/or in the region of a door sill 3 in the lateral region of the vehicle 1. For example, the user action serves to trigger an opening movement, e.g. of a tailgate 2 of the vehicle 1, for example.

In order to detect the user action of the user 9, a sensor device 100 of the system 300 according to the invention can be provided on the vehicle 1. To that end, e.g. a sensor element 110 of the sensor device 100 is arranged in the bumper 4 and/or in the sill 3. Alternatively or additionally, the sensor element 110 can also be arranged in a door handle 5 and thus be used as a proximity sensor for unlocking. The elongated extension of the sensor element 110 can be clearly discerned in FIG. 1, which can likewise be configured as a cable. In order to perform the detection, a control unit 200 is provided and electrically connected to the sensor element 110. Furthermore, a test connection between the control unit 200 and the sensor element 110 can be used for a functional test, wherein the test connection is enabled by a test connection adjustment 10 of the sensor element 110.

Figure 2:
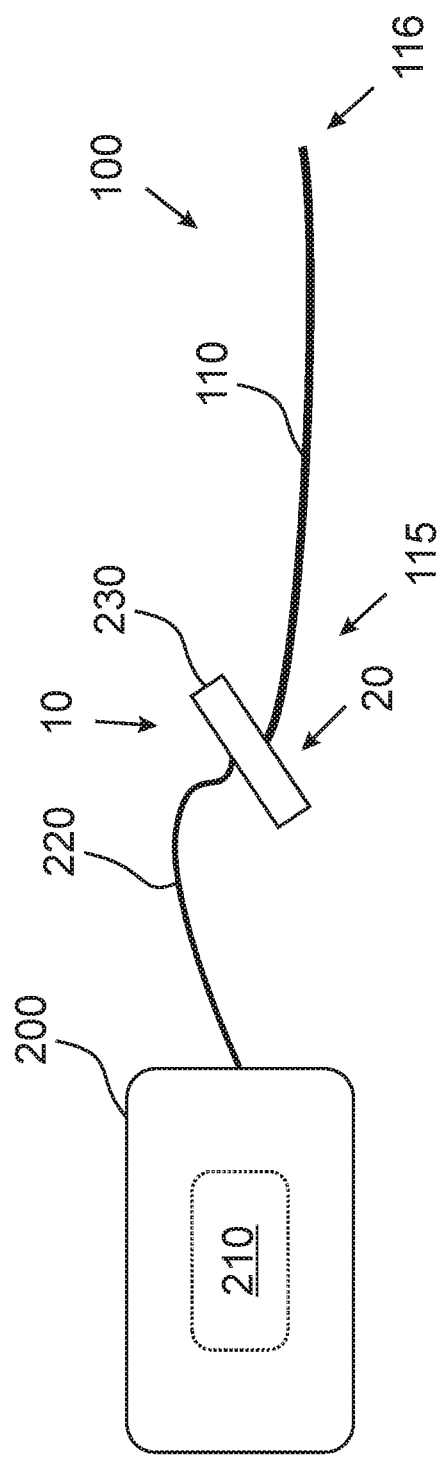
FIG. 2: an illustration of a sensor device according to the invention.

FIG. 2 schematically shows the connection between the control unit 200 and the sensor element 110 in further detail. It is thus discernable that the control unit 200 may comprise an evaluation device 210, such as a microcontroller. The latter must be connected electrically to the sensor element 110 (exclusively) at a first end 115 of the sensor element 110 for the detection as well as for the functional test. A further opposite end 116 can be configured in a non-connected or floating manner (as a free end 116). For the connection, as the case may be, a control unit line 220 extends from the control unit 200 to a plug 230. In order to create the connection to the plug 230, the test connection adaptation 10 can be provided on the sensor element 110. Furthermore, a part of the test connection adaptation 10 can be configured as an evaluation connection adaptation 20, which provides an electrically-conductive connection between the evaluation device 210 and the sensor element 110 for the detection of the user action.

Figure 3:
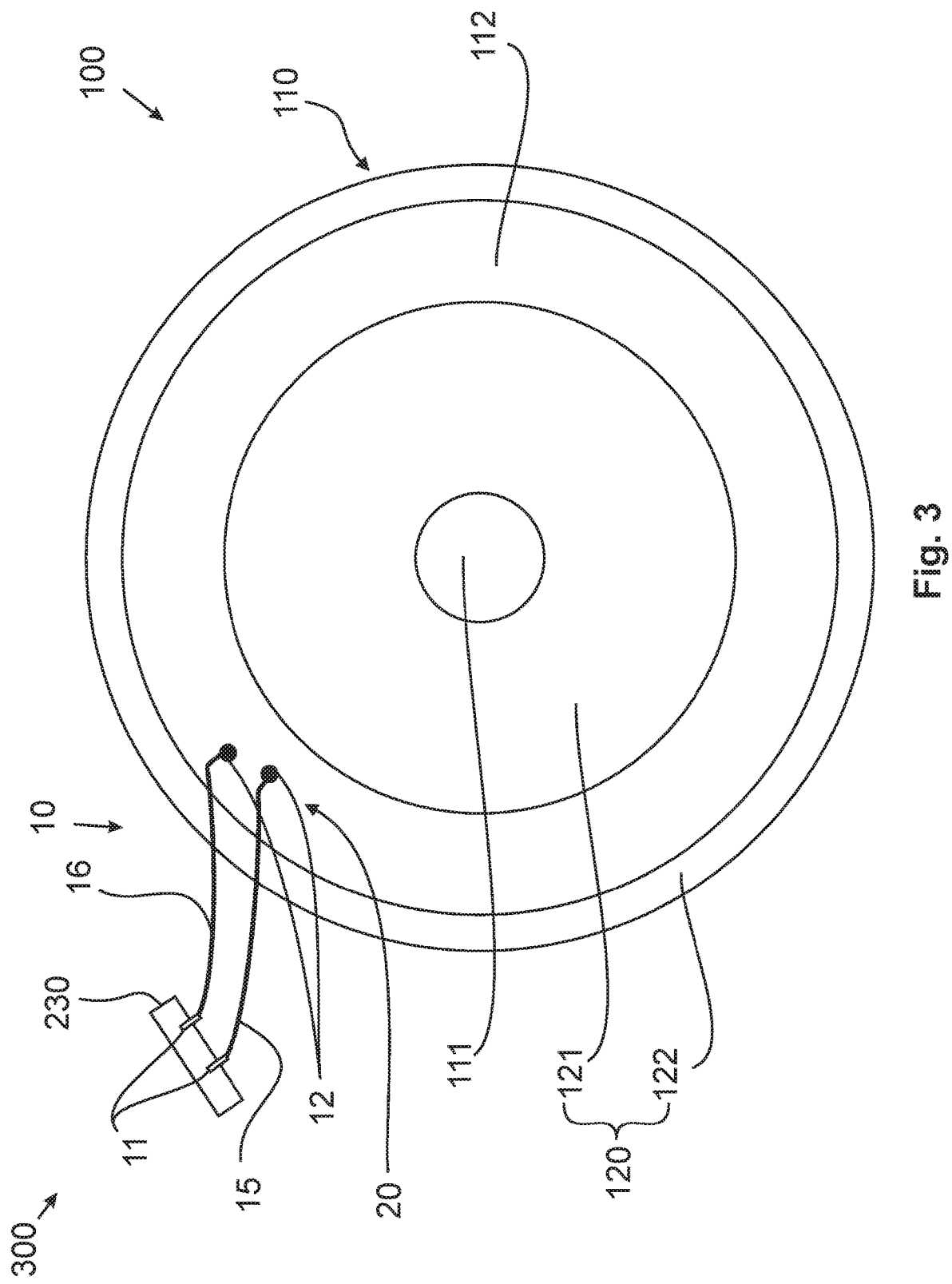
FIG. 3: a schematic representation of a cross-section of a sensor element, a sensor device according to the invention, and a system according to the invention.

FIG. 3 schematically clarifies this structure. A cross-section of the sensor element 110 is shown here, which comprises an inner conductor element 111 (as a core 111), an outer conductor element 112 (as a shield 112), as well as a first insulation element 121 arranged therebetween. Optionally, a second insulation element 122, in particular as a protective jacket or jacket 122 of the sensor element 110 can be arranged on an outermost periphery of the sensor element 110. The at least one insulation element 120 serves to improve the sensor properties of the sensor element 110. In particular, the first insulation element 121 serves to shield the inner conductor element 111 from the outer conductor element 112.

It is advantageous here if the sensor device 100 is formed as a capacitive distance sensor 100 and the sensor element 110 forms a sensor electrode, for example. In particular, the outer conductor element 112, preferably exclusively the outer conductor element 112 forms an active sensor surface of the sensor device 100. The (first) insulation element 121 is formed as a cylindric support body of an electrically non-conducting material, and preferably comprises a round cross-sectional surface and particularly preferably is formed of a solid material. It can be provided that the outer conductor element 112 encloses the (first) insulation element 121 in the type of a jacket, and/or consists of a solid material. It is of further advantage, that the first insulation element 121 is formed completely separate and/or at a distance from the second insulation element 122.

It is of particular advantage here, if the inner conductor element 111 is surrounded by the insulation element 120 not only in the circumferential direction, but is insulated from all sides, or is at least non-connected on all sides, as the case may be. For example, the only electric connection of the sensor element 110 to a vehicle electronics, such as the evaluation device 210, can be provided by the illustrated electric conductors, i.e. the first conductor 15 and the second conductor 16. In this case, conductors 15, 16 concern the respective current paths, that is, can also be produced from multiple conductor means (such as wires or strands). The test connection adaptation 10 can for example comprise the illustrated connection points 12, which form two points of an electric circuit, in particular current path, through the outer conductor element 112. A connection to the evaluation device 210 can be established via the plug 230, in order to close this electric circuit. In particular, this electric circuit is closed in the functional test, such that a current can flow through the first conductor 15 via the outer conductor element 112 and then through the second conductor 16. This allows a reliable determination as to whether the connection at the connection points 12 is provided as required in terms of proper functioning. In the region of the plug 230, the connection to the evaluation device 210 can be established via connection means, preferably crimp connectors 11. To that end, at least one wire and/or at least one strand of the outer conductor 112 is connected to the crimp connector 11 in a form-fit and/or force-fit manner. This allows a simple and reliable mounting.

The above description of the embodiments describes the present invention exclusively by way of examples. Individual features of the embodiments, as long as technically reasonable, can be freely combined with one another without departing from the scope of the present invention.

LIST OF REFERENCE CHARACTERS

1 Vehicle
2 Tailgate
3 Sill
4 Bumper
5 Door handle
9 User
10 Test connection adaptation, connection adaptation, crimp
11 Connection means, Crimp connector
12 Connection point
15 First conductor
16 Second conductor
20 Evaluation connection adaptation
100 Sensor device
110 Sensor element
111 Inner conductor element, core
112 Outer conductor element, shield
115 First end
116 Second end
120 Insulation element
121 First insulation element
122 Second insulation element, protective jacket
200 Control unit
210 Evaluation device
220 Control unit line
230 Connection interface, plug
300 System

What is claimed is:

1. A capacitive distance sensor device configured for capacitive detection of a user action in a vehicle, comprising:
a sensor electrode configured as an electric line having an electrically connected end connected to an evaluation device and an opposing electrically-insulated end, wherein the sensor electrode having:
an electrically-conducting outer conductor,
at least one insulation element for electric insulation of the outer conductor,
an evaluation connection formed on the outer conductor for electrically connecting the outer conductor to an evaluation device of the vehicle, whereby the capacitive detection of the user action based on a change in capacitance is performed during normal operation of the capacitive distance sensor device using exclusively the evaluation connection as connection path between the evaluation device and the sensor electrode, and
a test connection formed on the outer conductor, and
a plug electrically connected to close an electric circuit allowing a current to flow from the test connection through the outer conductor to the evaluation connection in order to perform a functional test of the evaluation connection of the capacitive distance sensor device using the electric circuit with the outer conductor, thereby allowing discrimination between missing change in capacitance indicative of missing user action and missing change in capacitance traced to faulty and/or interrupted electric connection between the evaluation connection and the evaluation device.

2. The capacitive distance sensor device according to claim 1, wherein the functional test is configured as a connection test.

3. The capacitive distance sensor device according to claim 1, wherein the sensor comprises an electrically-conductive inner conductor element, and the at least one insulation element surrounds the inner conductor element for the electric insulation.

4. The capacitive distance sensor device according to claim 1, wherein the sensor is configured as an electric cable and comprises an inner conductor as a core and the outer conductor as a shield.

5. The capacitive distance sensor device according to claim 1, wherein the outer conductor is configured as an electrically-conductive wire mesh.

6. The capacitive distance sensor device according to claim 1, wherein the sensor has a concentric structure and the outer conductor is arranged coaxially to an inner conductor of the sensor.

7. The capacitive distance sensor device according to claim 1, wherein the insulation element comprises first and second insulation elements which are arranged concentrically.

8. The capacitive distance sensor device according to claim 1, wherein the sensor has a longitudinal extent along a longitudinal axis; wherein the electrically connected end faces the evaluation device and the opposing electrically-insulated end faces away from the evaluation device; wherein at least the test connection or the evaluation connection are exclusively provided on one of the ends; wherein the capacitive distance sensor device, further comprises a first conductor and a second conductor connected to the outer conductor on only one of the ends; wherein the opposing electrically-insulated end is electrically connected as a floating end.

9. The capacitive distance sensor device according to claim 1, wherein the outer conductor and an inner conductor extend along a longitudinal extent of the sensor so that the inner conductor and the outer conductor run parallel to one another.

10. A system for the capacitive detection of a user action in a vehicle, the system includes the capacitive distance sensor device according to claim 1.

11. The system according to claim 10, wherein the plug is electrically connected to the evaluation device and a first and second conductor of the outer conductor is electrically connected to the evaluation device via the plug.

12. The system according to claim 10, wherein a first conductor adjacent to a second conductor is electrically-connected to the outer conductor, whereby the outer conductor is serially integrated in a current path to the first and second conductors.

13. A vehicle comprising a capacitive distance sensor device configured for capacitive detection of a user action in the vehicle, the vehicle comprising the capacitive distance sensor device according to claim 1.

14. The vehicle according to claim 13, wherein the capacitive sensor device is arranged in a bumper of the vehicle, in order to detect a movement of a foot of a user in the rear zone of the vehicle.

15. A method for operating a capacitive distance sensor device in a vehicle, wherein the following steps are provided:
  performing the capacitive detection of a user action in a vehicle using the capacitive distance sensor device according to claim 1,
  and performing a connection test in the capacitive distance sensor device by controlling the plug.

16. The method according to claim 15, wherein the following step is provided prior to the performing of the connection test:
  Connecting the sensor electrode of the capacitive distance sensor device to the evaluation device of the vehicle via the plug.

17. A capacitive distance sensor device configured for capacitive detection of a user action in a vehicle, comprising:
  a sensor electrode configured as an electric line having an electrically connected end connected to an evaluation device and an opposing electrically-insulated end,
  wherein the sensor electrode having:
    an electrically-conducting outer conductor,
    at least one insulation element for electric insulation of the outer conductor,
    an evaluation connection formed on the outer conductor for electrically connecting the outer conductor to an evaluation device of the vehicle, whereby the capacitive detection of the user action based on a change in capacitance is performed during normal operation of the capacitive distance sensor device using exclusively the evaluation connection as connection path between the evaluation device and the sensor electrode, and a test connection formed on the outer conductor, and
    a plug electrically connected to close an electric circuit allowing a current to flow from the test connection through the outer conductor to the evaluation device in order to perform a functional test of the capacitive distance sensor device, thereby allowing discrimination between missing change in capacitance indicative of missing user action and missing change in capacitance traced to faulty and/or interrupted electric connection between the evaluation connection and the evaluation device, wherein for the capacitive detection of the user action only the evaluation connection is provided by the evaluation device, so that only a single electrical conductor leads from the evaluation device to the evaluation connection, and the closed electric circuit in which two electrical conductors lead via the test connection to the evaluation device is used for the functional test.

18. A capacitive distance sensor device configured for capacitive detection of a user action in a vehicle, comprising:
  a sensor electrode configured as an electric line having an electrically connected end connected to an evaluation device and an opposing electrically-insulated end,
  wherein the sensor electrode having:
    an electrically-conducting outer conductor,
    at least one insulation element for electric insulation of the outer conductor,
    an evaluation connection formed on the outer conductor for electrically connecting the outer conductor to an evaluation device of the vehicle, whereby the capacitive detection of the user action based on a change in capacitance is performed during normal operation of the capacitive distance sensor device using exclusively the evaluation connection as connection path between the evaluation device and the sensor electrode, and
    a test connection formed on the outer conductor, and
    a plug electrically connected to close an electric circuit allowing a current to flow from the test connection through the outer conductor to the evaluation device in order to perform a functional test of the capacitive distance sensor device, thereby allowing discrimination between missing change in capacitance indicative of missing user action and missing change in capacitance traced to faulty and/or interrupted electric connection between the evaluation connection and the evaluation device, wherein the evaluation connection exclusively comprises a first electrical conductor for connecting the evaluation device to the outer conductor for evaluation of the capacitive detection, and the test connection comprises at least one second electrical conductor and the first electrical conductor for connecting the evaluation device to the outer conductor element and providing the electric circuit for performing the functional test.

* * * * *